United States Patent
Franco-Vila et al.

(10) Patent No.: US 7,018,079 B1
(45) Date of Patent: Mar. 28, 2006

(54) AIRCRAFT ESCAPE SLIDE LIGHTING SYSTEM

(75) Inventors: Jose Franco-Vila, Fort Lauderdale, FL (US); Philip Pelfrey, Fort Lauderdale, FL (US); Glenn Levine, Fort Lauderdale, FL (US)

(73) Assignee: DME Corporation, Fort Lauderdale, FL (US)

( * ) Notice: Subject to any disclaimer, the term of this patent is extended or adjusted under 35 U.S.C. 154(b) by 99 days.

(21) Appl. No.: 10/200,260

(22) Filed: Jul. 22, 2002

Related U.S. Application Data

(60) Provisional application No. 60/307,210, filed on Jul. 23, 2001.

(51) Int. Cl.
*F21V 1/20* (2006.01)
*F21V 15/00* (2006.01)

(52) U.S. Cl. .................. 362/470; 362/253; 362/311

(58) Field of Classification Search ............... 362/470, 362/800, 234, 253, 240, 267, 576, 294, 311, 362/252, 145, 414; 324/414; 182/48, 18
See application file for complete search history.

(56) References Cited

U.S. PATENT DOCUMENTS

| | | | |
|---|---|---|---|
| 3,463,915 A * | 8/1969 | Day ........................... | 362/34 |
| 3,621,383 A * | 11/1971 | Rush et al. ................. | 324/414 |
| 4,774,643 A | 9/1988 | McGinnis et al. .......... | 362/189 |
| 5,027,259 A * | 6/1991 | Chujko ....................... | 362/582 |
| 5,528,476 A | 6/1996 | Fenton ....................... | 362/249 |
| 5,586,615 A * | 12/1996 | Hammer et al. ............. | 182/48 |
| 5,848,837 A * | 12/1998 | Gustafson ................... | 362/235 |
| 5,856,777 A | 1/1999 | Rullman et al. ........ | 340/426.22 |
| 6,158,882 A * | 12/2000 | Bischoff, Jr. ................ | 362/488 |
| 6,406,173 B1 * | 6/2002 | Serizawa et al. ........... | 362/545 |

* cited by examiner

Primary Examiner—John Anthony Ward
Assistant Examiner—Bao Q. Truong
(74) Attorney, Agent, or Firm—Malin, Haley & DiMaggio, P.A.

(57) ABSTRACT

The present invention is a lighting system for providing illumination to an aircraft evacuation slide. Light sources are safely utilized with an existing evacuation slide, a substantial improvement over prior assemblies that use a hard, plastic housing enclosing the light source. The invention increases light transmission, eliminates housing cracking, inadvertent puncturing, clouding, and decreases weight and cost of conventional slide systems. Each assembly comprises a mounting surface and a printed circuit board thereon, light sources, preferably light-emitting diodes (LEDs) mounted on the mounting surface, the light sources illuminating the aircraft evacuation slide, and a flexible containment covering, such as a heat shrink wrap that covers the assembly and protects the light sources. A protective shield can cover the mounting surface while allowing the LEDs to protrude through an aperture in the shield, protecting the LEDs from damaging forces while allowing light to illuminate the landing area.

18 Claims, 5 Drawing Sheets

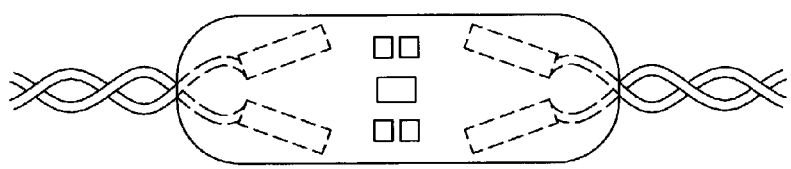
*Fig - 2A*
*Prior Art*
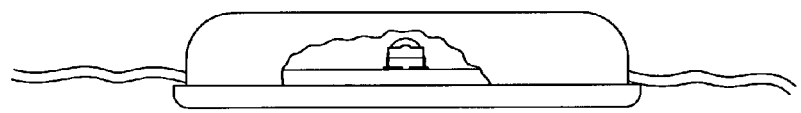 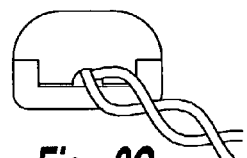
*Fig - 2B*          *Fig - 2C*
*Prior Art*         *Prior Art*
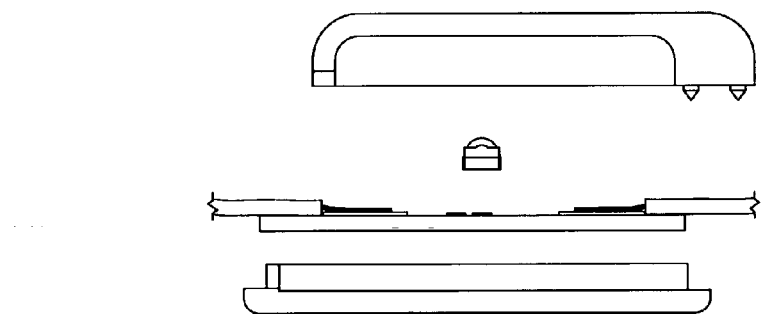
*Fig - 2D*
*Prior Art*
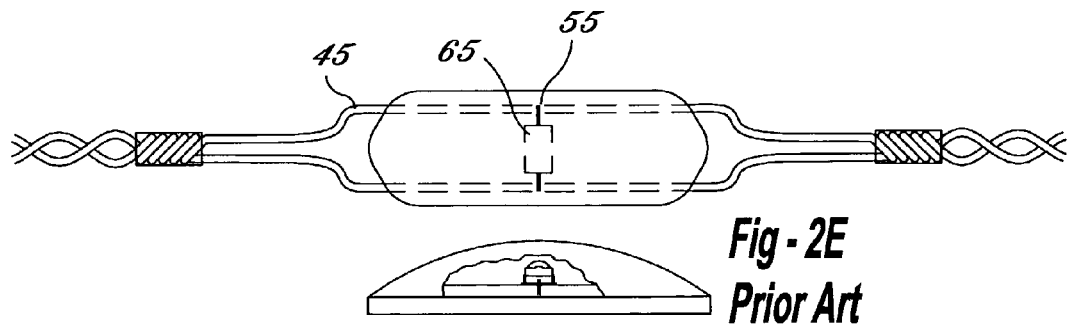
*Fig - 2E*
*Prior Art*

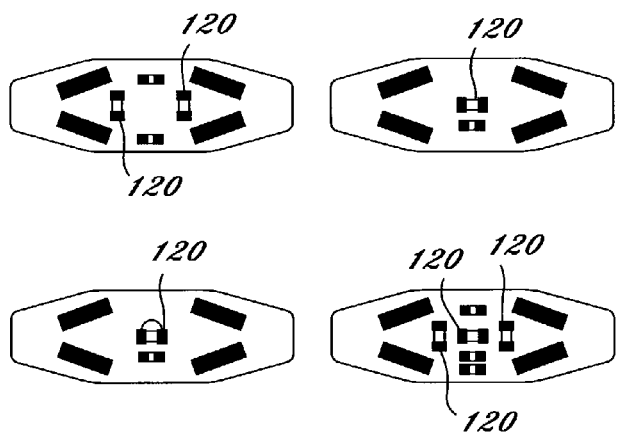
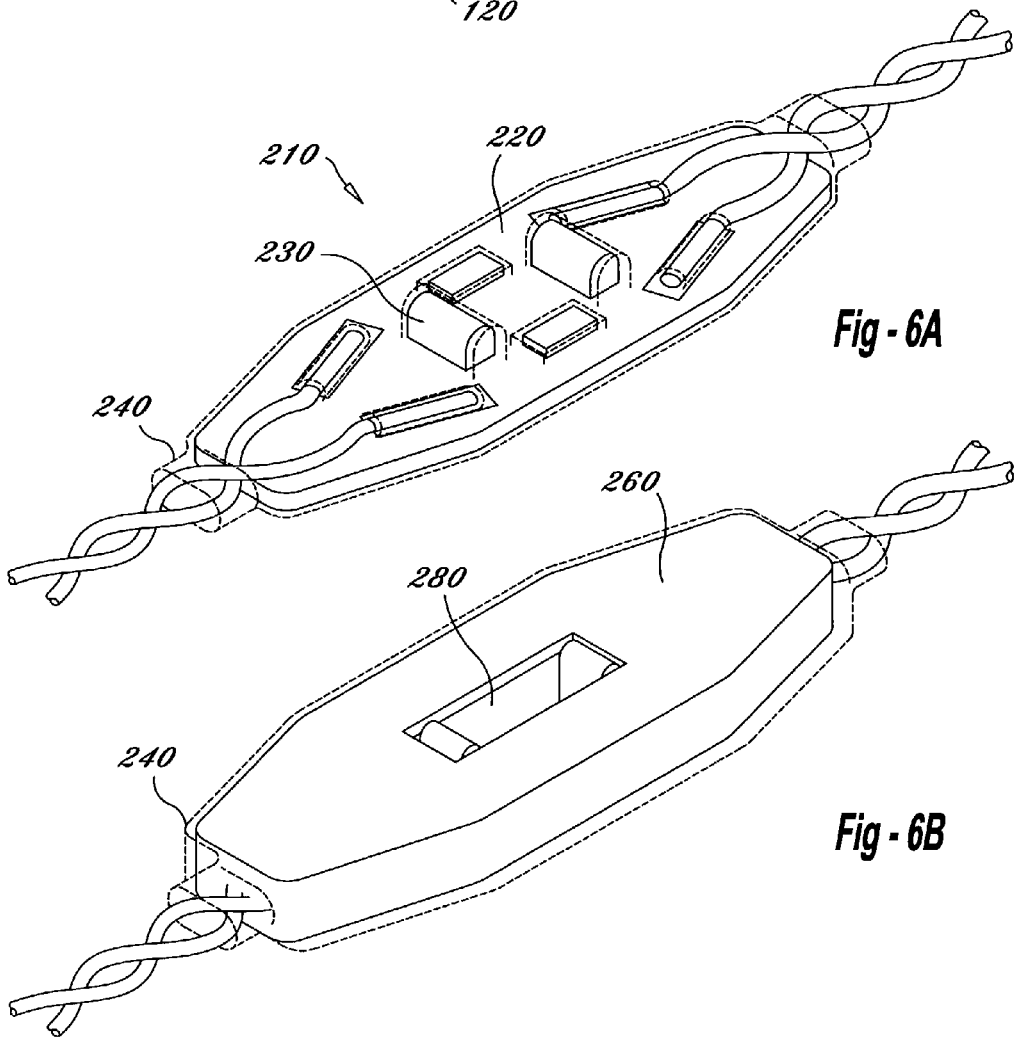
*Fig - 4*
*Fig - 6A*
*Fig - 6B*

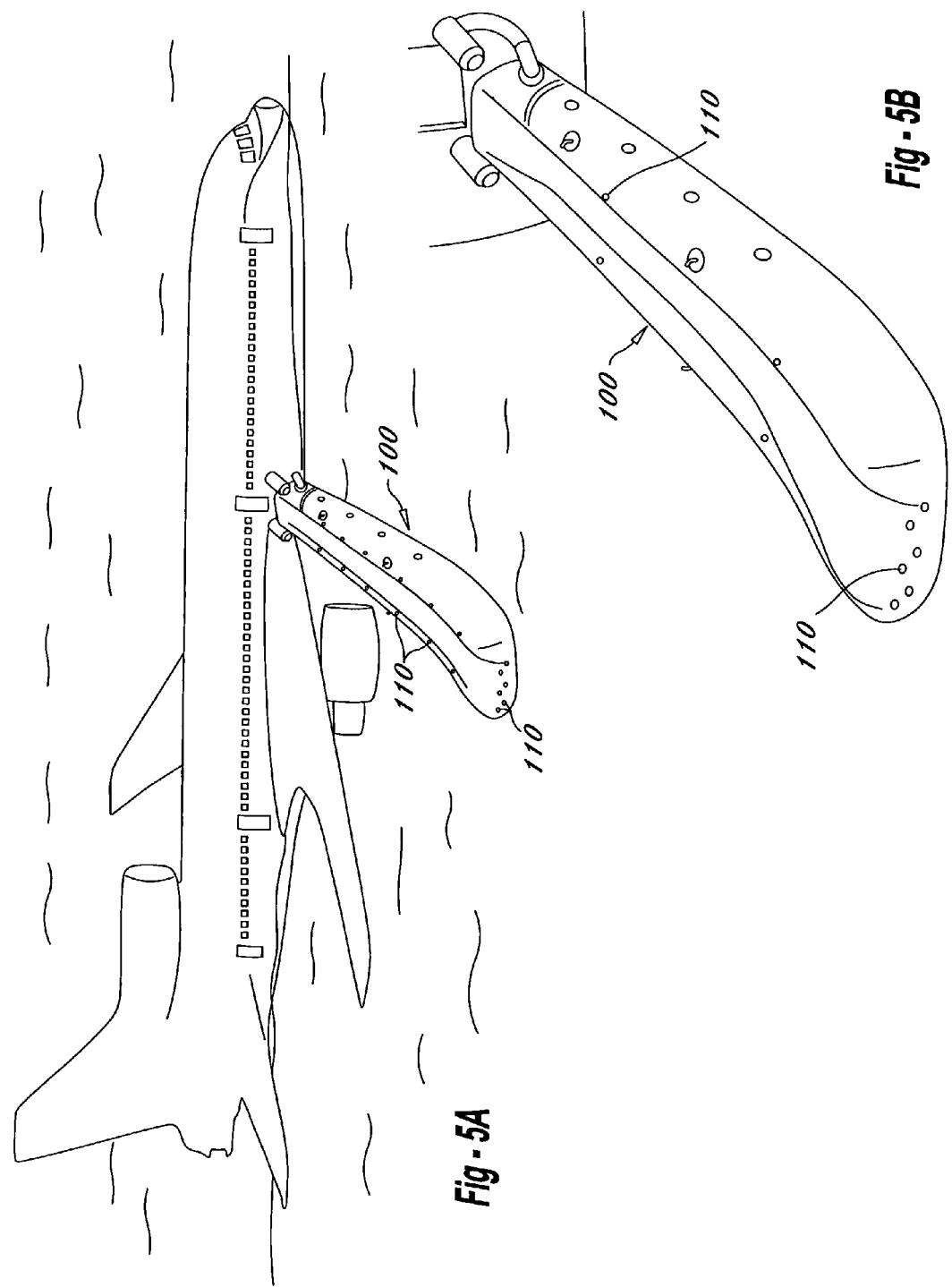

AIRCRAFT ESCAPE SLIDE LIGHTING SYSTEM

This application claims the benefit of and priority to provisional application Ser. No. 60/307,210, filed on Jul. 23, 2001.

BACKGROUND OF THE INVENTION

1. Field of the Invention

The present invention relates generally to illuminated aircraft evacuation systems and in particular to a lighting system for providing illumination to an aircraft evacuation slide or slide raft that emits more light, is more durable, more dependable and more cost-effective than conventional slide lighting systems.

2. Description of the Prior Art

Aircraft evacuation often occurs at night, or under low light conditions, thus mandating the need for an illumination system to allow occupants of the aircraft to evacuate via an escape slide. Lights are often placed along the evacuation slide perimeter to illuminate the sliding lane area and the end of the slide where the evacuee's feet first touch the ground during an emergency evacuation from an aircraft. Needless to say, sufficient illumination strength and targeting is essential and often a matter of life or death during aircraft evacuation, whether on land or at sea.

Typical evacuation slides of the prior, art include lighting systems consisting of incandescent light bulbs or light emitting diodes (LEDs) as the light source. The light source is often encased in a clear, hard, plastic housing that serves to house and protect the light source from the elements. These hard, plastic housings often break under pressure, often occurring when the evacuation slide is folded during non-use. Further, the hard, unyielding plastic covering of these housings take up additional volume therefore increasing the volume of the slide or raft and increasing the difficulty in packing the unit.

Examples of previous illumination systems include U.S. Pat. No. 3,621,383 issued to Rush for "Lighting System For Folded Inflatable Escape Slides With Means For Testing System With Slide In Folded Condition"; U.S. Pat. No. 4,774,643 issued to McGinnis et al. for "Illuminator For Radiation Dosimter and Method of Manufacture"; U.S. Pat. No. 5,528,476 issued to Fenton for a "Lighting Apparatus For Use On Kites"; U.S. Pat. No. 5,856,777 issued to Rullman et al. for a "Simulated Vehicle Alarm"; and U.S. Pat. No. 6,158,882 issued to Bischoff, Jr. for an "LED Semiconductor Lighting System".

Each of the afore-mentioned systems utilizes a bulb or enclosure to house an LED. However, none of the systems disclose a lighting system applicable to an aircraft evacuation slide. Further, the use of a plastic housing to enclose the LED severely limits light transmission, as the light from the LED must first travel through the plastic encasement before reaching its target area. In an aircraft evacuation scenario, the prior art use of hard plastic housings over the LEDs would seriously increase the probability of system failure since evacuation slides are tightly compressed during storage and the increased level of packing pressure could lead to cracking of the plastic LED enclosures. Such plastic housings or enclosures include an internal space or air gap, which is susceptible to collapsing under pressure, tensile, or bending stresses. Unsupported air gaps are inherently susceptible to failure. A point load, line load, or distributed load, when exceeding a relatively low threshold force or pressure, can cause the housing to collapse.

An additional problem occurring with the use of conventional LED lighting systems utilizing a plastic housing to encase the light source is the inability of the lighting system to perform properly in an aquatic scenario, such as evacuation of a downed aircraft at sea. When submerged in salt or fresh water, prior art plastic housing designs contain a plurality of wire inlet/outlet holes allowing water or other fluids to attack the electrical components inside the housing. The entrance of liquid into the housing may result in the liquid becoming frozen under cold conditions causing fracture and failure of the housing and the light source within. Moisture can also cause condensation within the housing, discoloring the housing, thereby reducing the strength of light output. Finally, the elimination of the plastic housing will result in an illumination assembly of lighter weight and lower volume, resulting in a cost savings.

Accordingly, what is needed in the art, is a lighting assembly which can safely and effectively be utilized with an existing aircraft evacuation slide and which eliminates the need for a hard, plastic housing enclosing the light source thereby increasing light transmission, eliminating housing cracking, eliminating inadvertent puncturing of the evacuation slide/raft, eliminating potential injury to evacuees, eliminating housing clouding, and decreasing the overall weight and cost of conventional slide lighting systems. What is also needed is a lighting assembly that provides a heat sink to prevent the light source from overheating and incorporates a design that allows any sea water to drain by providing an opening in the enclosure thereby preventing water buildup in the assembly which may cause irreparable damage to the light source.

It is therefore, to the effective resolution of the aforementioned problems and shortcomings that the present invention is directed.

SUMMARY OF THE INVENTION

The present invention provides an illumination system for use in aircraft evacuation slides. The illumination device is comprised of a plurality of assemblies, each including one or more light emitting diodes (LEDs) secured to and electrically connected to either a mounting surface or the surface of a printed circuit board. Each assembly is secured to the evacuation slide by conventional attachment means and protected from environmental factors by the use of a containment covering that completely covers the LED and/or all electrical components. In one embodiment, heat shrink wrap material can be used to completely cover each lighting assembly and safely protect the LEDs therein.

The LEDs in each assembly are strategically placed on the mounting surface and encased in a flexible containment covering to direct the light from the LED to the appropriate sliding surface of the evacuation slide and the evacuee's expected landing area.

In the preferred embodiment, the invention is an illumination module assembly for use on an aircraft evacuation slide, the assembly comprising a mounting surface, one or more light sources, preferably light-emitting diodes (LEDs) mounted on the mounting surface wherein the one or more light sources provide illumination for the aircraft evacuation slide, and a flexible containment covering to secure the one or more light sources to the mounting surface.

In the preferred embodiment, the flexible containment covering is comprised of heat shrink material. Preferably the heat shrink material is open at either end or both ends to allow water that has entered the assembly a path of egress.

In an alternate embodiment, the assembly further comprises a printed circuit board disposed upon the mounting surface wherein the one or more light sources are mounted upon the printed circuit board. The printed circuit board provides a heat sink to prevent the one or more light sources from overheating.

The illumination assembly may also include protective shield to protect the light sources against excessive forces due to packing, including compressive loads and lateral loads which cause bending and shear stresses. The protective shield covers most of the mounting surface, yet includes an opening to allow the LEDs to be exposed and light from the LEDs to project toward the target area. The flexible containment covering completely covers the protective shield and the mounting surface.

In an alternate embodiment, the protective shield further comprises adhering means in order to join the protective shield to the mounting surface.

The invention is also a light assembly used on an aircraft emergency evacuation slide comprised of one or more of the illumination assemblies described above disposed along the substantial outer edge of said slide, where each assembly comprises a mounting surface, one or more light sources mounted on the mounting surface wherein the one or more light sources provide illumination for the aircraft evacuation slide, and a flexible containment covering to secure said one or more light sources to said mounting surface.

In the preferred embodiment, the flexible containment covering is comprised of heat shrink material. Preferably the heat shrink material is open at either end or both ends to allow water that has entered the assembly a path of egress.

In an alternate embodiment, the assembly further comprises a printed circuit board disposed upon the mounting surface wherein the one or more light sources are mounted upon the printed circuit board. The printed circuit board provides a heat sink to prevent the one or more light sources from overheating.

The illumination assembly may also include protective shield to protect the light sources against unwanted excessive forces. The protective shield covers most of the mounting surface, yet includes an opening to allow the LEDs to be exposed. The flexible containment covering is applied over the protective shield.

In an alternate embodiment, the protective shield further comprises adhering means in order to join the protective shield to the mounting surface.

The illumination system of the present invention is designed for use on aircraft escape slides of the type commonly deployed by all airlines. Each assembly comprises an LED affixed to the surface of a printed circuit board. Instead of a plastic housing covering the light source, a heat shrink with or without an adhesive lining is used to cover the LED(s) and printed circuit board.

Accordingly, it is an object of the present invention to provide an aircraft evacuation slide illumination system that can be secured to any conventional evacuation slide and does not include a plastic housing to cover the light source.

It is another object of the present invention to provide an aircraft evacuation slide illumination system that can accurately project light onto the evacuation slide and evacuee exit area without the light strength being reduced or diffracted by travel through a plastic housing.

It is still another object of the present invention to provide an aircraft evacuation slide illumination system which can fully operate in environments up to 100 percent condensing humidity and even underwater without the risk of the LED housing becoming fogged, iced over or discolored which may lead to a decrease in the strength and accuracy of the projected light.

It is yet another object of the present invention to provide a lighting assembly with a flexible housing that will allow the projection of light yet can withstand over 2,000 pounds of pressure.

In accordance with these and other objects which will become apparent hereinafter, the instant invention will now be described with particular reference to the accompanying drawings.

BRIEF DESCRIPTION OF THE DRAWINGS

The invention may be better understood by reference to the drawings in which:

FIG. 2A is a top view illustrating a conventional illumination assembly of the prior art utilizing an LED;

FIG. 2B is a side elevational view illustrating a conventional illumination assembly of the prior art utilizing an LED;

FIG. 2C is an end view illustrating a conventional illumination assembly of the prior art utilizing an LED;

FIG. 2D is an exploded view illustrating a conventional illumination assembly of the prior art utilizing an LED;

FIG. 2E is an exploded view illustrating an alternative conventional illumination assembly of the prior art utilizing an LED;

FIG. 4 illustrates various assembly configurations in which the LEDs may be mounted upon a mounting surface in accordance with the present invention.

FIG. 5A is a perspective view of the escape slide illumination system in accordance with the present invention.

FIG. 5B is a perspective view of an alternate escape slide or raft, incorporating the illumination system in accordance with the present invention.

FIG. 6A is a perspective view illustrating the housingless module design for the illumination system in accordance with the present invention.

FIG. 6B is a perspective view of an alternative embodiment of the housingless module design depicting the illumination system in accordance with the present invention.

DESCRIPTION OF THE PREFERRED EMBODIMENTS

Figure 1A:
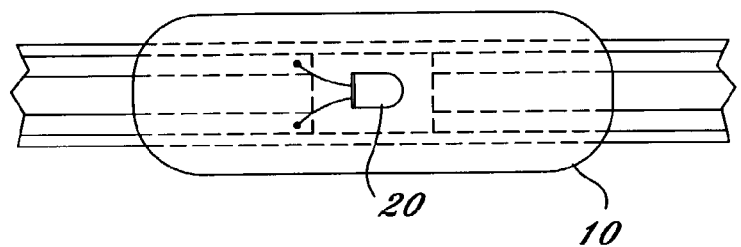
FIG. 1A is a top view illustrating a conventional illumination assembly of the prior art utilizing an incandescent light bulb.
Figure 1B:
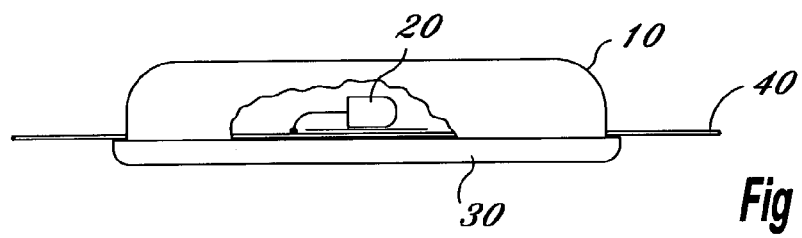
FIG. 1B is a side elevational view illustrating a conventional illumination assembly of the prior art utilizing an incandescent light bulb.
Figure 1C:
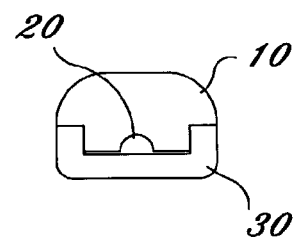
FIG. 1C is an end view illustrating a conventional illumination assembly of the prior art utilizing an incandescent light bulb.
Figure 1D:
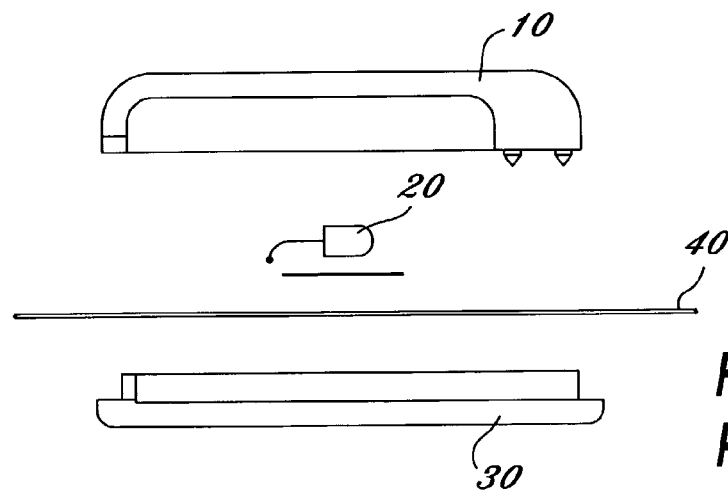
FIG. 1D is an exploded view illustrating a conventional illumination assembly of the prior art utilizing an incandescent light bulb.

As seen in FIGS. 1A–1D, an illumination assembly commonly used in the prior art, is shown. A plastic housing 10 encloses the light source 20, a glass incandescent lamp, which is secured to a housing base 30. A 20 AWG conductive wire 40 carries electrical current to light source 20. Plastic housing 10 completely encloses the light bulb 20, leading to a multitude of potential problems. For example, plastic housing 10 can crack, cloud and shatter thereby rendering the illumination assembly inoperable. Plastic housing 10 can shatter under point contact, line contact and bearing loads of only 375 pounds.

In FIGS. 2A–2D, another prior art illumination system is shown. In these figures, a housing cover completely covers an LED, which is mounted on a housing base, along with the conductive wire. Once again, due to possible cracking or clouding of the plastic housing or the freezing of moisture within the housing, the evacuation slide and the evacuation area may not be adequately illuminated, thereby compromising the safety of the aircraft evacuees. Further, light must first pass through a plastic encasement, reducing the intensity of the emitted light. The housing also prevents the transfer of heat which damages the LED.

FIG. 2E illustrates an alternative prior art device wherein the center conductor or wire 45 is stripped at or near a center point 55. An LED 65 which protrudes through a hole is utilized in this design, which does not include a printed wiring board, and also includes structure which is problematic in the prior art as set forth above.

Referring now to FIGS. 3A–3D, an illumination assembly 110 of the present invention 100 is shown. In the preferred embodiment, one or more illumination assemblies 110 are secured to an aircraft evacuation slide via conventional attachment means. Each assembly 110 includes one or more illumination sources 120, preferably LEDs, secured to a mounting surface 130. The mounting surface can be of any material typical of printed wiring boards, planar arrays, or alternative materials, and in the preferred embodiment is a printed circuit board to which one or more LEDs 120 can be mounted.

In lieu of the hard plastic housing of the prior art, a transparent flexible containment covering 140 is fitted and secured over the assembly 110. In the preferred embodiment, the transparent flexible containment covering 140 is a heat shrink wrap material and is fitted and secured over the lighting assembly. Heat shrink material 140 can cover the entire assembly 110, including the one or more LEDs 120 provided individually or in an array 125, and mounting surface 130, or, in the alternative an aperture can be provided in the shrink wrap material at one or both ends allowing water that may enter the assembly to easily flow out thereby preventing water damage due to freezing, clouding, or water effects to the assembly and its electrical components. As described above, the mounting surface 130 acts as a heat shield 135.

In an alternate embodiment, heat shrink material 140 has apertures in it to allow the LEDs 120 or some of the electrical components on the printed circuit board to protrude through.

Although the preferred light source is an LED, other light sources would provide similar results. However, the elimination of the plastic housing of the prior art is critical to the function and improved capabilities of the present invention. A power source supplies power to the conductive wires 150, which carry electric current to LEDs 120.

Figure 3A:
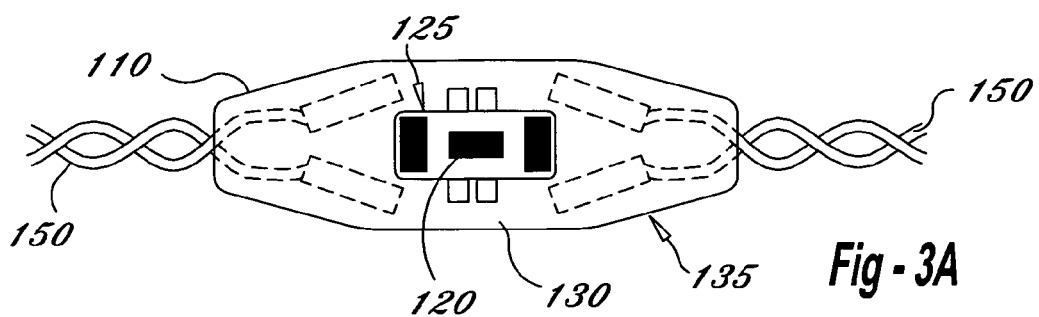
FIG. 3A is a top view of the escape slide illumination assembly in accordance with the present invention.
Figure 3B:
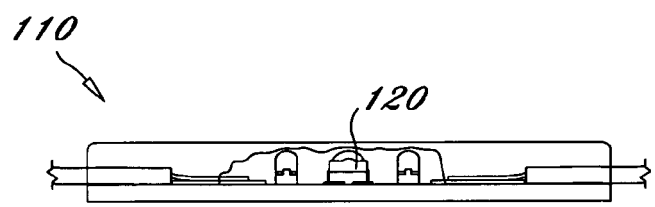
FIG. 3B is a side elevational view of the escape slide illumination assembly in accordance with the present invention.
Figure 3C:
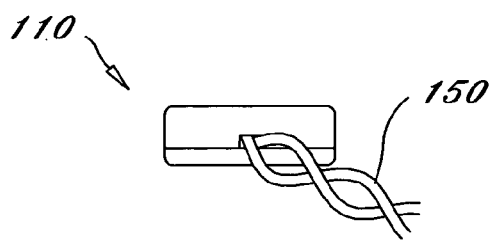
FIG. 3C is an end view of the escape slide illumination assembly in accordance with the present invention.
Figure 3D:
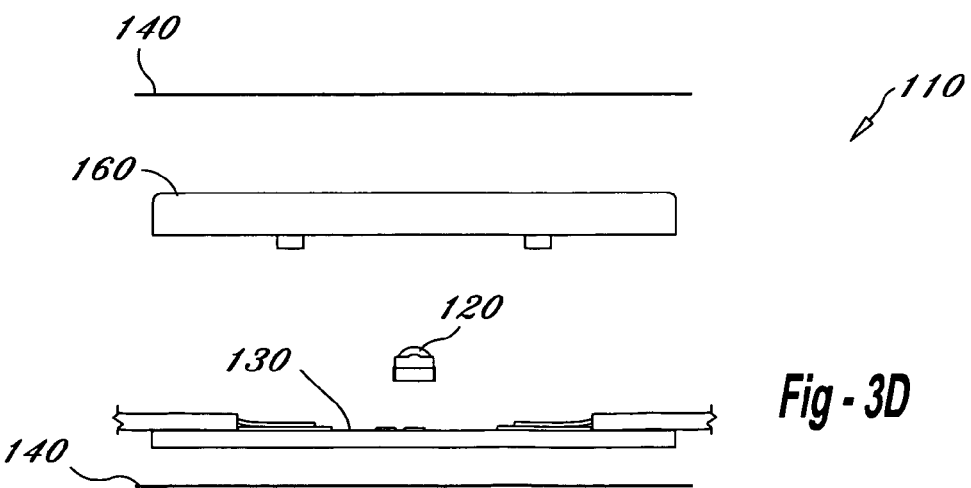
FIG. 3D is an exploded view of the escape slide illumination assembly in accordance with the present invention.

In an alternate embodiment shown in FIG. 3D, assembly 110 includes a protective shield 160 placed over the mounting surface 130 and secured thereto. Shield can either be held in place over the mounting surface by the flexible containment material 140, or an adhesive substance can be used to adhere the shield to the mounting surface.

Referring to FIG. 3A, it can be seen that shield 160 includes an aperture in its center portion to allow the LEDS 120 to be exposed while covering electrical leads and solder connections. Wires 150, soldered to mounting surface 130, are secured beneath shield 160. Therefore, only the LEDs 120 and perhaps some other electrical components on the printed circuit board (if used) are exposed. Shield 160 is designed so its height is at substantially the same level as the tops of the LEDs thereby protecting the LEDs from shear or other deleterious forces that may occur. In this fashion, the shield can protect the LEDs from forces in excess of approximately 2,000 or more pounds.

The elimination of the plastic housing covering the light source in the illumination system of the present invention eliminates any hazards associated with the breaking or damaging of the outer plastic covering used in conventional illumination systems. The lighting assembly can withstand surface loads in excess of approximately 2,000 or more pounds created from the folding, packing, and compressing of the aircraft escape slide pack, without sustaining any damage to the lighting assembly. This is more than five times the load capabilities of conventional plastic housings. A plastic housing with incandescent bulbs would likely crack under such a load, damaging the light source and resulting in a failure of the system.

The aircraft evacuation lighting system of the present invention includes assemblies that are capable of withstanding extreme temperatures. The present invention can operate between temperatures of approximately −40 degrees Fahrenheit up to approximately +160 degrees Fahrenheit. These limits are approximate only, and it is within the spirit of the invention to provide an illumination assembly capable of withstanding even greater temperature extremes without any damage occurring to the light source.

From examination of FIGS. 3A–3D, it is evident that the overall thickness of assembly 110 of the present invention is much less than the thickness of the conventional lighting assemblies as shown in FIGS. 1A–1D and FIGS. 2A–2D, due to the elimination of the hard plastic encasement. The resultant illumination assembly takes up less volume, weighs less and is less expensive to manufacture than conventional illumination assemblies. The use of a heat shrink wrap material around the light source provides a greater degree of protection to the LEDs, thereby increasing overall reliability, durability and dependability when used in conjunction with aircraft evacuation slide systems. However, with this added transparent protective material, the illumination range of the LEDs is not compromised. In fact, the illumination performance is improved as the heat shrink acts as a lens.

One of the key features of the present invention is the design of the universal printed circuit board 130. In FIG. 4, it can be seen that a number of different LED configurations can be created upon PCB 130. However, for each configuration, the same PCB is used, except that the LEDS are arranged in a different pattern. In this fashion, different assemblies can be created for different customer lighting requirements. Shield 160 includes a central aperture that is adapted to allow one LED, or a plurality of LEDs 120, to protrude therethrough, regardless of the LED and electrical component configuration.

It is important to recognize that the housingless module design of the instant invention contains no internal spaces or air gaps which are susceptible to load failures. Such design substantially increases the resistance to external forces, significantly increasing point load, line load, and distributed load thresholds for failure. That is, the modules of the instant invention can withhold applied loads which are multiples higher than those of prior art housings. The low profile of the instant invention further increases the strength of the unit.

FIG. 5A shows the present invention 100 in its preferred embodiment wherein a plurality of illumination assemblies 110 are secured around the outer periphery of an aircraft's emergency escape slide. Lighting units are also placed at the end of the slide, as toe-end lights. Here, it can be seen that the assemblies provide light around the landing area of the slide. Needless to say, any clouding or cracking of the assembly housings, or water buildup within the housing, would seriously compromise the illumination capabilities of the LEDs and exacerbate and already hazardous situation.

FIG. 5B illustrates an enhanced, perspective view of a particular slide/raft incorporating the illumination assembly of the instant invention.

FIG. 6A further illustrates a perspective view of a housingless design module 210. In this embodiment, the wiring board 220 is illustrated, with LEDs 230 mounted thereon. The transparent shrink wrap 240 is shown in a dotted line configuration. This illustrates the flexibility of the universal mounting board, which allows for the option of adding a circuit board with discrete lines or areas of continuity, and specialty configurations based upon specific end uses desired by the customer. This is significant, as different lighting patterns can be extremely important when placed about different positions of the slide or slide/raft unit, indicating appropriate directions, boundaries, and the like. This perspective view also illustrates that the housingless module is a vented unit, which is not affected by changes in temperature, humidity, or pressure. It does not become fogged or obscured, such as the housing units utilized or disclosed in the prior art. This is especially true in emergency situations, when it is critical that the lighting assemblies function properly.

It is to be noted that alternative materials can be utilized for the transparent heat shrink, which would provide the same structure and function as disclosed herein. This includes, among other things, an external wrap which acts in part as a lens, focusing and/or enhancing the light source.

FIG. 6B is a perspective view of an alternative embodiment of the instant invention which further includes a protective shield 260. This shield includes a generally centered aperture 280 which provides the function of exposing the light source or sources, and defining the opening through which the light propagates. In an alternative embodiment, the housingless module shield is manufactured of the same material as the printed wiring mounting boards or the separate printed circuit boards.

Although the illumination system of the present invention is primarily concerned in aircraft evacuation safety, the lighting assemblies of the present invention are equally applicable in any scenario where reliable and accurate illumination is necessary. Airport runways, side-of-the-road illumination in the case of an accident, or underwater rescue scenarios, are just a few of the many situations in which the present invention can be applied.

It will be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. An illumination assembly for use on an aircraft evacuation slide, said assembly comprising:
   a mounting surface;
   one or more light sources mounted on said mounting surface, wherein said one or more light sources to provide illumination for said aircraft evacuation slide;
   a substantially transparent flexible containment covering heat shrunk directly over the mounting surface and light sources to protect said one or more light sources to said mounting surface;
   wherein said flexible containment covering is open at either end or both ends to provide a source of water egress.

2. The illumination assembly of claim 1 wherein said flexible containment covering is comprised of transparent heat shrink material.

3. The illumination assembly of claim 1 further comprising a printed circuit board disposed upon said mounting surface, wherein said one or more light sources are mounted upon said printed circuit board, said printed circuit board providing a heat sink to prevent said one or more light sources from overheating.

4. The illumination assembly of claim 3 wherein said light sources may be arranged in a plurality of configurations upon said printed circuit board without the need for retooling or redesigning the mounting surface.

5. The illumination assembly of claim 1 wherein said one or more light sources are light emitting diodes.

6. An aircraft evacuation slide comprising one or more illumination assemblies, each said assembly comprising:
   a mounting surface;
   one or more light sources mounted on said mounting surface, wherein said one or more light sources provide illumination for said aircraft evacuation slide; and
   a flexible containment covering to protect said one or more light sources on said mounting surface,
   wherein said illumination assembly further comprises a protective shield to shield said one or more light sources against unwanted deleterious forces, wherein said shield is enclosed in heat shrink material,
   wherein said protective shield further comprises adhering means in order to join said protective shield to said mounting surface.

7. An illumination assembly for use on an aircraft evacuation slide, said assembly comprising:
   a mounting surface;
   one or more light sources mounted on said mounting surface, wherein said one or more light sources to provide illumination for said aircraft evacuation slide;
   a substantially transparent flexible containment covering heat shrunk directly over the mounting surface and light sources to protect said one or more light sources to said mounting surface; and
   a protective shield to shield said one or more light sources against unwanted deleterious forces wherein said shield is enclosed in said flexible containment covering.

8. The illumination assembly of claim 7 wherein said protective shield further comprises adhering means in order to join said protective shield to said mounting surface.

9. An illumination assembly for use on an aircraft evacuation slide, said assembly comprising:
- a mounting surface;
- a printed circuit board disposed upon said mounting surface;
- one or more light sources mounted on said printed circuit board, said one or more light sources to provide illumination for said aircraft evacuation slide, wherein said printed circuit board provides a heat sink to prevent said one or more light sources from overheating; and
- a transparent flexible containment covering to protect said one or more light sources on said printed circuit board, said transparent flexible containment covering open at either end or both ends to provide a source of water egress.

10. The illumination assembly of claim 9 further comprising a protective shield to shield said one or more light emitting diodes against unwanted deleterious forces, wherein said shield is enclosed in said transparent flexible containment covering.

11. An aircraft evacuation slide comprising one or more illumination assemblies, each said assembly comprising:
- a mounting surface;
- one or more light sources mounted on said mounting surface, wherein said one or more light sources provide illumination for said aircraft evacuation slide;
- a flexible containment covering heat shrunk directly onto the mounting surface and light sources to protect said one or more light sources on said mounting surface;
- said flexible containment covering being comprised of heat shrink material; and
- wherein said heat shrink material is open at either end or both ends to provide a source of water egress.

12. The aircraft evacuation slide of claim 11 wherein said one or more mounting surfaces are disposed along the substantial outer edge of said slide.

13. The aircraft evacuation slide of claim 11 wherein each said illumination assembly further comprises a printed circuit board disposed upon said mounting surface, wherein said one or more light sources are mounted upon said printed circuit board, said printed circuit board providing a heat sink to prevent said one or more light sources from overheating.

14. The aircraft evacuation slide of claim 11 wherein said one or more light sources are light emitting diodes.

15. An aircraft evacuation slide comprising one or more illumination assemblies, each said assembly comprising:
- a mounting surface;
- one or more light sources mounted on said mounting surface, wherein said one or more light sources provide illumination for said aircraft evacuation slide;
- a flexible containment covering heat shrunk directly onto the mounting surface and light sources to protect said one or more light sources on said mounting surface; and
- wherein said illumination assembly further comprises a protective shield to shield said one or more light sources against unwanted deleterious forces, wherein said shield is enclosed in heat shrink material.

16. The aircraft evacuation slide of claim 15 wherein said protective shield further comprises adhering means in order to join said protective shield to said mounting surface.

17. An illumination assembly for use on an aircraft evacuation slide, said assembly comprising:
- a mounting surface;
- one or more light sources mounted on said mounting surface, wherein said one or more light sources to provide illumination for said aircraft evacuation slide; and
- a substantially transparent flexible containment covering to protect said one or more light sources to said mounting surface,
- further comprising a protective shield to shield said one or more light sources against unwanted deleterious forces wherein said shield is enclosed in said flexible containment covering.

18. The illumination assembly of claim 17 wherein said protective shield further comprises adhering means in order to join said protective shield to said mounting surface.

* * * * *